(12) United States Patent
Sakai et al.

(10) Patent No.: US 9,102,153 B2
(45) Date of Patent: Aug. 11, 2015

(54) PROCESSES FOR PRODUCING SUBSTRATE FOR LIQUID EJECTION HEAD

(71) Applicant: CANON KABUSHIKI KAISHA, Tokyo (JP)

(72) Inventors: Toshiyasu Sakai, Kawasaki (JP); Masataka Kato, Hiratsuka (JP); Kenji Kumamaru, Urayasu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/283,480

(22) Filed: May 21, 2014

(65) Prior Publication Data

US 2014/0363907 A1 Dec. 11, 2014

(30) Foreign Application Priority Data

Jun. 6, 2013 (JP) ................. 2013-119767

(51) Int. Cl.
*B41J 2/16* (2006.01)
*H01J 37/32* (2006.01)

(52) U.S. Cl.
CPC .............. *B41J 2/1603* (2013.01); *B41J 2/1628* (2013.01); *B41J 2/1631* (2013.01); *B41J 2/1639* (2013.01); *B41J 2/1642* (2013.01); *B41J 2/1646* (2013.01); *H01J 37/32935* (2013.01)

(58) Field of Classification Search
CPC ...... B41J 2/1646; B41J 2/1639; B41J 2/1642; H01J 37/32935; H01L 21/30655; B81C 1/00404

See application file for complete search history.

(56) References Cited

U.S. PATENT DOCUMENTS

| 6,305,788 B1 * | 10/2001 | Silverbrook .................... 347/54 |
| 8,647,896 B2 | 2/2014 | Sakai |
| 2009/0095708 A1 | 4/2009 | Kubota et al. |
| 2009/0212008 A1 * | 8/2009 | Uyama et al. .................. 216/27 |
| 2014/0008322 A1 | 1/2014 | Abo et al. |

FOREIGN PATENT DOCUMENTS

JP 2009-137155 A 6/2009

* cited by examiner

*Primary Examiner* — Richard Booth
(74) *Attorney, Agent, or Firm* — Fitzpatrick, Cella, Harper & Scinto (57) ABSTRACT

A process for producing a substrate for a liquid ejection head, including a step of forming a liquid supply port passing through a silicon substrate by dry etching, the step being a step of sequentially repeating the steps of (1) forming an etching protection film on the silicon substrate, (2) removing a bottom portion of the etching protection film, and (3) etching the silicon substrate, wherein a sheath formed in the step (2) is thicker than a sheath formed in the step (3).

13 Claims, 6 Drawing Sheets

PROCESSES FOR PRODUCING SUBSTRATE FOR LIQUID EJECTION HEAD

BACKGROUND OF THE INVENTION

1. Field of the Invention

The present invention relates to a process for producing a substrate for a liquid ejection head.

2. Description of the Related Art

As methods for forming a liquid supply port in a substrate for a liquid ejection head, a method of using drilling, laser beam machining or sand blasting, a method of forming a liquid supply port by anisotropic etching and a method of forming a liquid supply port by dry etching have been proposed. Among these methods, the method of forming the liquid supply port by the dry etching using an etching gas can form a liquid supply port of an almost vertical form, so that a chip size can be made smaller than the method of forming the liquid supply port by the anisotropic etching. Regarding the method of forming the liquid supply port by the dry etching, Japanese Patent Application Laid-Open No. 2009-137155 discloses a process in which a common liquid supply port is formed from the side of a back surface of a substrate, and an independent liquid supply port is then formed in a bottom thereof by dry etching.

SUMMARY OF THE INVENTION

According to the process disclosed in Japanese Patent Application Laid-Open No. 2009-137155, the independent liquid supply port is formed in the bottom of the common liquid supply port by the dry etching. However, the process causes a phenomenon called tilt, by which the independent liquid supply port is formed slantingly depending on the three-dimensional shape of the common liquid supply port. When the tilt is markedly caused, the opening position of the independent liquid supply port in a front surface of the substrate greatly deviates from a desired position, so that reliability is lowered to cause a possibility that the chip size is increased. Thus, an object of the present invention is to provide a process for producing a substrate for a liquid ejection head, by which the occurrence of tilt can be inhibited without lowering productivity.

According to the present invention, there is provided a process for producing a substrate for a liquid ejection head, comprising a step of forming a liquid supply port passing through a silicon substrate by dry etching, the step being a step of sequentially repeating the steps of (1) forming an etching protection film on the silicon substrate, (2) removing a bottom portion of the etching protection film, and (3) etching the silicon substrate, wherein a sheath formed in the step (2) is thicker than a sheath formed in the step (3).

According to the present invention, there is also provided a process for producing a substrate for a liquid ejection head, comprising a step of forming a liquid supply port in a silicon substrate, the step comprising the steps of (a) forming a common liquid supply port in the silicon substrate, and (b) forming an independent liquid supply port passing through the silicon substrate in a bottom of the common liquid supply port by dry etching, the step (b) being a step of sequentially repeating the steps of (1) forming an etching protection film on the silicon substrate, (2) removing a bottom portion of the etching protection film, and (3) etching the silicon substrate, wherein a sheath formed in the step (2) is thicker than a sheath formed in the step (3).

According to the present invention, there is further provided a process for producing a substrate for a liquid ejection head, comprising a step of forming a liquid supply port in a silicon substrate, the step comprising the steps of (a) forming a common liquid supply port in the silicon substrate, and (b) forming an independent liquid supply port passing through the silicon substrate in a bottom of the common liquid supply port by dry etching, the step (b) being a step of sequentially repeating the steps of (1) forming an etching protection film on the silicon substrate, (2) removing a bottom portion of the etching protection film, and (3) etching the silicon substrate, wherein a source power in the step (2) is lower than a source power in the step (3).

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Figure 4:
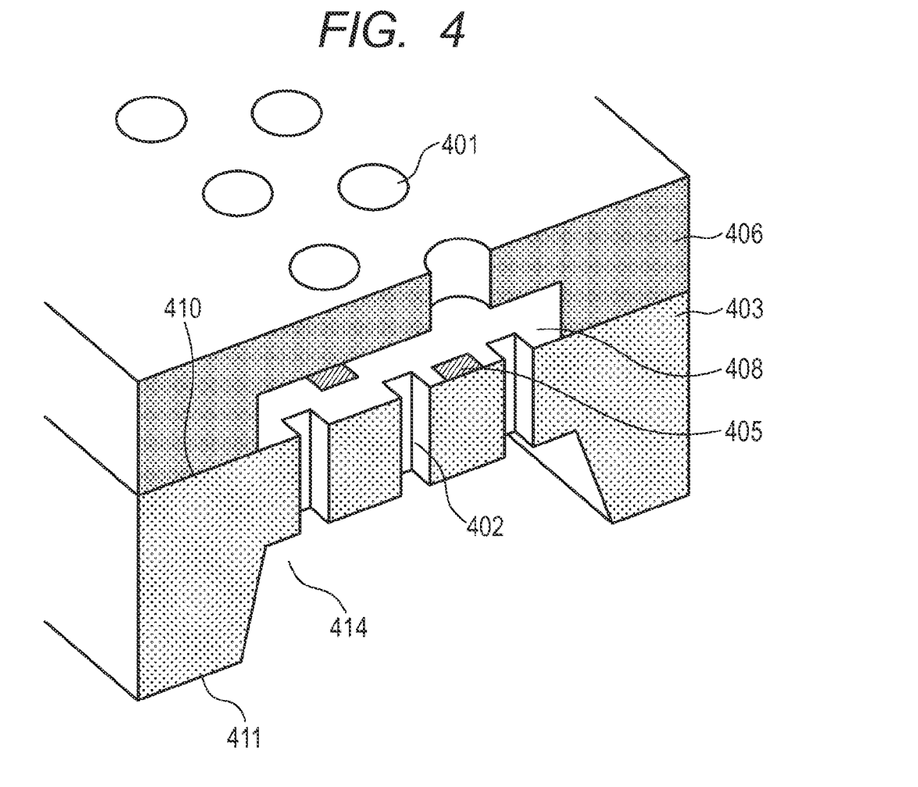
FIG. 4 is a typical sectional view illustrating an exemplary substrate for a liquid ejection head produced by the process according to the present invention.

The structure of an exemplary substrate for a liquid ejection head produced by the process according to the present invention is described with reference to FIG. 4. The substrate for the liquid ejection head illustrated in FIG. 4 is provided with a silicon substrate 403, an ejection-orifice-forming member 406 laminated on the silicon substrate 403 and an ejection-energy-generating element 405. A liquid flow path 408 to be filled with a liquid to be ejected is formed on the side of a first surface 410 of the silicon substrate 403. In addition, a common liquid supply port 414 is formed on the side of a second surface 411 of the silicon substrate 403. An independent liquid supply port 402 is formed in the interior of the common liquid supply port 414 so as to reach the first surface 410 of the silicon substrate 403. The liquid is supplied to the liquid flow path 408 through the common liquid supply port 414 and the independent liquid supply port 402. In addition, the ejection-orifice-forming member 406 is formed by sequentially laminating a plurality of resin layers on the silicon substrate 403. Further, a liquid ejection orifice 401 for ejecting the liquid is formed in the ejection-orifice-forming member 406 so as to communicate with the liquid flow path 408. incidentally, the common liquid supply port 414 is formed in the silicon substrate 402 illustrated in FIG. 4; however, the common liquid supply port 414 may not be formed.

The process for producing the substrate for the liquid ejection head according to the present invention will now be described. The process for producing the substrate for the liquid ejection head according to the present invention is a process for producing a substrate for a liquid ejection head, which includes a step of forming a liquid supply port passing through a silicon substrate by dry etching, the step being a step of sequentially repeating the steps of (1) forming an etching protection film on the silicon substrate, (2) removing a bottom portion of the etching protection film and (3) etching the silicon substrate, and a sheath formed in the step (2) is thicker than a sheath formed in the step (3).

The process for producing the substrate for the liquid ejection head according to the present invention is also a process for producing a substrate for a liquid ejection head, which includes a step of forming a liquid supply port in a silicon substrate, the step comprising the steps of (a) forming a common liquid supply port in the silicon substrate and (b) forming an independent liquid supply port passing through the silicon substrate in a bottom of the common liquid supply port by dry etching, the step (b) being a step of sequentially repeating the steps of (1) forming an etching protection film on the silicon substrate, (2) removing a bottom portion of the etching protection film and (3) etching the silicon substrate, wherein a sheath formed in the step (2) is thicker than a sheath formed in the step (3).

According to the processes according to the present invention, a liquid supply port perpendicular to the substrate can be formed without lowering the productivity to inhibit increase in chip size and lowering of reliability by the tilt. In particular, the liquid supply port is formed by a Bosch process which will be described subsequently in the processes according to the present invention, and a sheath formed in the step of forming the etching protection film is thicker than a sheath formed in the step of etching the silicon substrate, whereby distortion of the sheath is inhibited, and an ion is vertically incident on the silicon substrate, so that the occurrence of the tilt can be inhibited. Incidentally, the thickness of the sheath gets thick, for example, when the source power in each step is reduced. Therefore, the sheath formed in the step (2) can be made thicker than the sheath formed in the step (3) by making the source power in the step (2) lower than the source power in the step (3). The processes according to the present invention will hereinafter be described in detail.

Figure 6A:
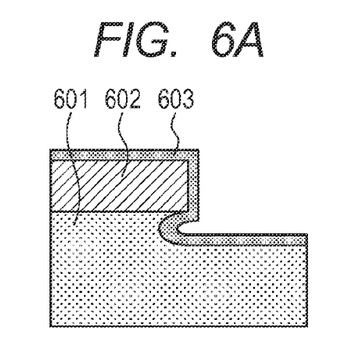
FIGS. 6A, 6B and 6C are sectional views typically illustrating respective steps in a Bosch process.
Figure 6B:
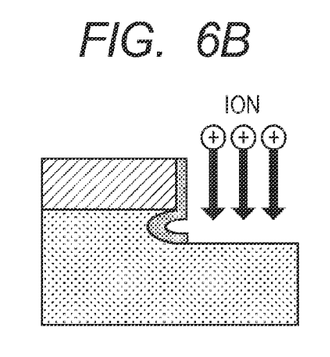
Figure 6C:
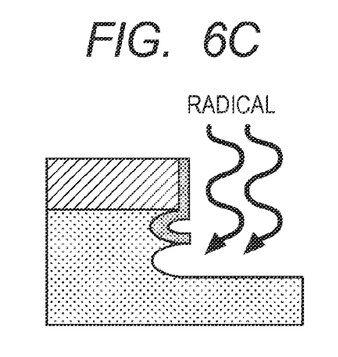

In the processes according to the present invention, a dry etching process (reactive ion etching process), or the so-called Bosch process, is used as a method for forming a deep hole or groove in the silicon substrate. Typical sectional views of respective steps in the Bosch process are illustrated in FIGS. 6A to 6C. A desired etching mask 602 is first formed on a silicon substrate 601. An etching protection film 603 is then formed (step (1), also referred to as a protection film forming step, FIG. 6A). The etching protection film 603 is formed on side walls of a hole and a groove by, for example, plasma mainly using a fluorocarbon (CF) gas. A bottom portion of the etching protection film 603 is then removed (step (2), also referred to as a protection film removing step, FIG. 6B). A portion of the etching protection film 603 in the bottom of the hole is removed by, for example, plasma mainly using $SF_6$ gas. The silicon substrate 601 is then etched (step (3), also referred to as an Si etching step, FIG. 6C). The silicon substrate 601 is etched by, for example, plasma mainly using $SF_6$ gas. An apparently vertical hole can be formed by sequentially repeating these three steps.

Figure 8:
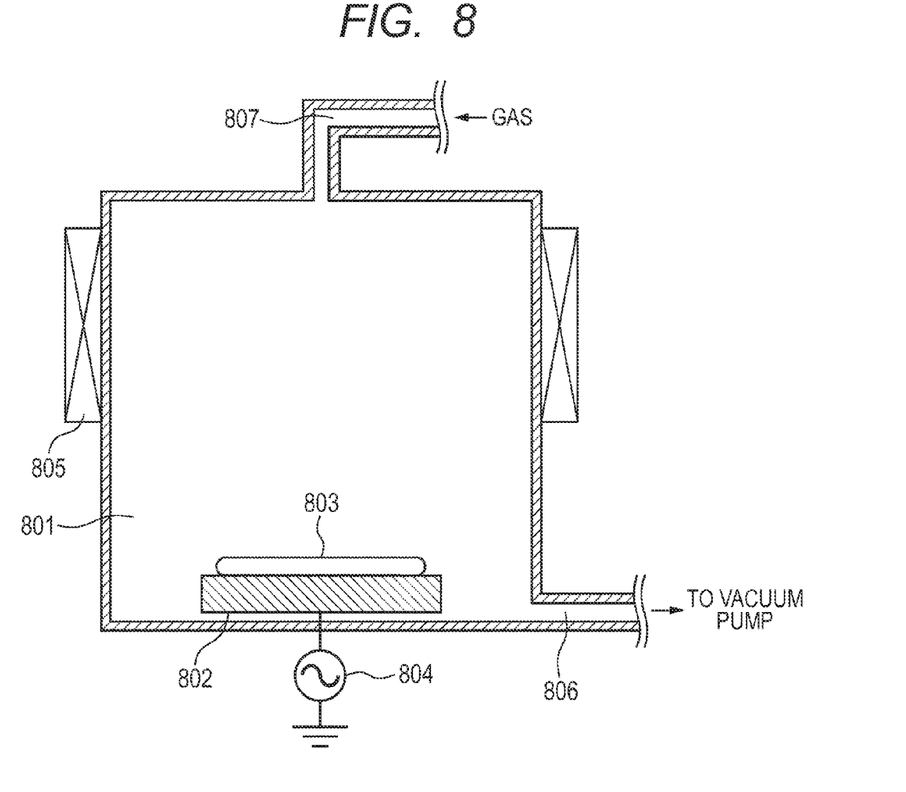
FIG. 8 is a sectional view schematically illustrating the construction of an exemplary dry etching apparatus.

The schematic construction of an exemplary apparatus for performing the dry etching is illustrated in FIG. 8. The apparatus illustrated in FIG. 8 is provided with an etching chamber 801 in which an object 803 to be etched is stored, and a substrate stage 802 which is provided at a lower portion within the etching chamber 801 and on which the object 803 to be etched is placed. The apparatus is also provided with a gas supply unit 807 for supplying an etching gas and a protection film forming gas at desired flow rates to the interior of the etching chamber 801, and a unit 806 for reducing a pressure within the etching chamber 801. The apparatus is further provided with a plasma generation unit 805 (source power) which is provided on an outer periphery of the etching chamber 801 and generates plasma by applying high-frequency power to a coil, and with a substrate bias generating unit 804 (bias power) which applies high-frequency power to the substrate stage 802.

Figure 5:
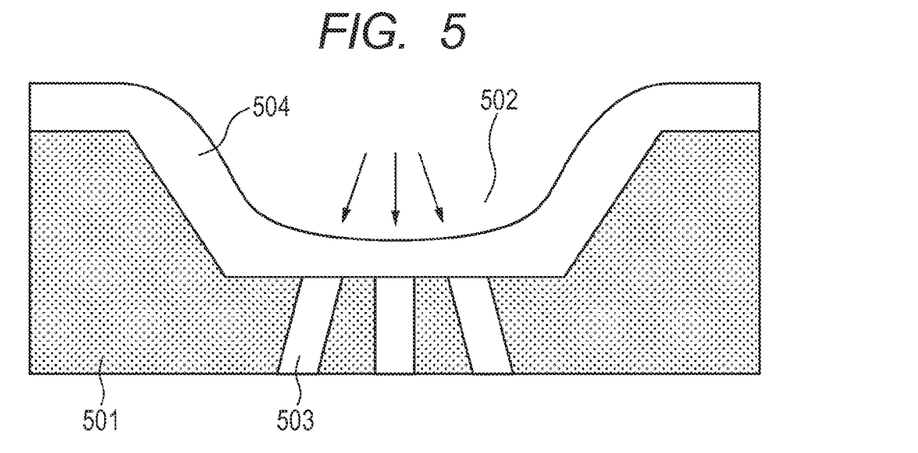
FIG. 5 is a sectional view typically illustrating a sheath with respect to a common liquid supply port.

Here, the cause of generation of the tile is described. A space charge layer called a sheath is formed on the surface of the silicon substrate during the dry etching. An ion which becomes an etching species is incident in a direction perpendicular to this sheath. At this time, when distortion is caused on the sheath 504 as illustrated in FIG. 5, the ion is incident slantingly on the silicon substrate 501. For this reason, an independent liquid supply port 503 is formed slantingly to the silicon substrate 501 to cause a phenomenon called tilt. Examples of the cause why the sheath is distorted include influence of a process such as a plasma distribution and influence of a three-dimensional shape of the silicon substrate. in the silicon substrate 501 illustrated in FIG. 5, the sheath 504 is formed along the three-dimensional shape of a common liquid supply port 502, so that distortion is caused on the sheath 504.

In order to reduce the tilt caused, it is effective to make the sheath thick to inhibit the distortion of the sheath. Here, the thickness of the sheath can be calculated according to the so-called Child-Langmuir Law. According to this law, the sheath can be made thick by decreasing the plasma density during the dry etching. However, when the plasma density is decreased, the etching rate is lowered, so that productivity is lowered.

Figure 7A:
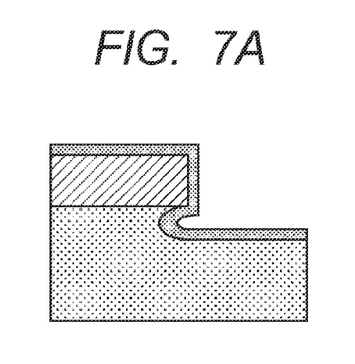
FIGS. 7A, 7B and 7C are sectional views typically illustrating a phenomenon of tilt generation in the Bosch process.
Figure 7B:
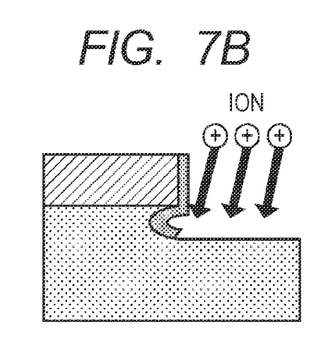
Figure 7C:
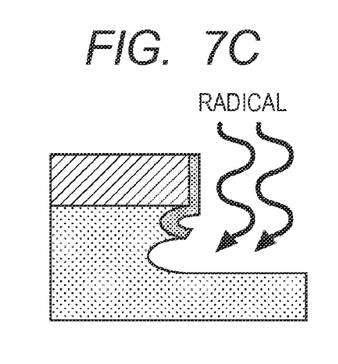

A phenomenon of generation of tilt in the Bosch process will now be described in detail with reference to FIGS. 7A to 7C. In the Bosch process, the etching is caused to proceed by repeating the plural steps as described above. In the protection film removing step, the ion is caused to be incident on the substrate by increasing the bias power to efficiently remove the etching protection film located at the bottom. At this time, when the ion is incident slantingly on the silicon substrate 501 due to the distortion of the sheath as illustrated in FIG. 7B, the etching protection film is biasedly removed, so that it is inferred that a hole is slantingly formed in the Si etching step as illustrated in FIG. 7C. That is, it is important to cause the ion to be vertically incident in the protection film removing step. The sheath in this step is made thick, whereby the tilt can be inhibited. In addition, in the subsequent Si etching step, a tendency toward isotropic etching is increased by increasing the plasma density and decreasing the bias power, whereby the tilt can be reduced while inhibiting the lowering of the etching rate.

No particular limitation is imposed on a method for making the thickness of the sheath formed in the protection film removing step thicker than the thickness of the sheath formed in the Si etching step. Examples of the method include a method of making the source power in the protection film removing step lower than the source power in the Si etching step and a method of increasing the bias power in the protection film removing step. Since there is a limit in increasing the bias power from the viewpoint of the construction of the apparatus, the method of making the source power in the protection film removing step lower than the source power in the Si etching step can more simply achieve the effect. When the source power in the protection film removing step is made lower than the source power in the Si etching step, the reduction rate of the source power in the protection film removing step with respect to the source power in the Si etching step is favorably 10% or more and 50% or less. When the reduction rate of the source power is 10% or more, whereby the sheath formed in the protection film removing step can be made sufficiently thick. In addition, the reduction rate of the source power is 50% or less, whereby plasma can be stably generated. Incidentally, the reduction rate of the source power is a value expressed by the following expression.

Reduction rate (%) of Source Power=[(Source power in the Si etching step)−(Source power in the protection film removing step)]/(Source power in the Si etching step)×100

Figure 1A:
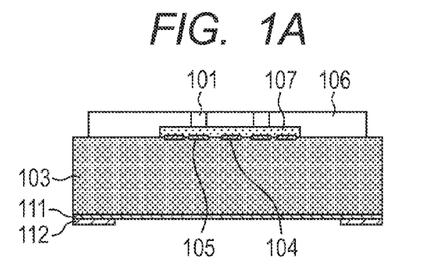
FIGS. 1A, 1B, 1C, 1D, 1E, 1F, 1G and 1H are sectional views illustrating an exemplary process for producing a substrate for a liquid ejection head according to the present invention.

An exemplary embodiment of the processes according to the present invention is illustrated in FIGS. 1A to 1H. Incidentally, the present invention is not limited to the following embodiment. As illustrated in FIG. 1A, an etch-stop layer 104 is first formed on a front surface of a silicon substrate 103 on which an ejection-energy-generating element 105 has been arranged. In addition, an insulation film (not illustrated) is formed so as to cover the ejection-energy-generating element 105 and the etch-stop layer 104. Aluminum may be used as a material for the etch-stop layer 104. An oxidized film of silicon may be used as the insulation film. A thermally oxidized film 111 is then formed on a back surface of the silicon substrate 103. An adherence layer (not illustrated), a positive resist 107, which is a mold material to be a liquid flow path, and an ejection-orifice-forming member 106 forming a flow path wall and a liquid ejection orifice 101 are then formed on the front surface of the silicon substrate 103. Poly(ether amide) may be used as a material for the adherence layer. An etching mask 112 is then formed on the back surface of the silicon substrate 103 for subsequently forming a common liquid supply port 114. Poly(ether amide) may be used as a material for the etching mask 112.

Figure 1B:
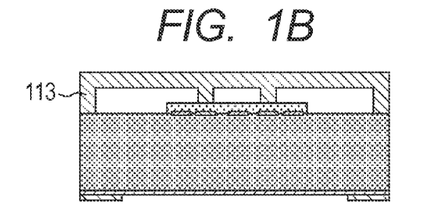
Figure 1C:
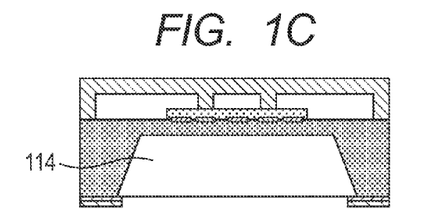
Figure 1D:
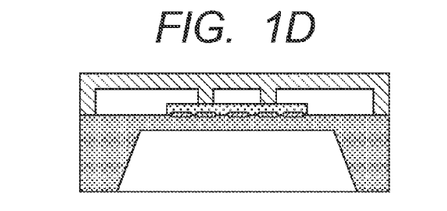
Figure 1E:
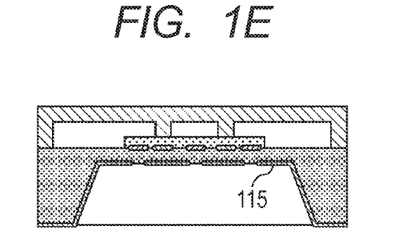

As illustrated in FIG. 1B, a protection resist 113 for protecting the silicon substrate 103 and the ejection-orifice-forming member 106 against an alkaline solution is then formed on the surfaces thereof. For example, OBC (trade name, product of TOKYO OHKA KOGYO CO., LTD.) may be used as a material for the protection resist 113. As illustrated in FIG. 1C, the silicon substrate 103 is then immersed in an alkaline solution to form the common liquid supply port 114. For example, a TMAH (tetramethylammonium hydroxide) solution may be used as the alkaline solution. No particular limitation is imposed on the depth of the common liquid supply port 114. However, the depth may be controlled to, for example, 300 µm or more and 650 µm or less. As illustrated in FIG. 1D, the etching mask 112 and the thermally oxidized film 121 are then removed. As illustrated in FIG. 1E, a mask 115 for forming an independent liquid supply port is then formed. No particular limitation is imposed on a method for forming the mask 115 for forming the independent liquid supply port. However, the mask 115 can be formed by, for example, evenly applying a photosensitive material by means of a sprayer and then forming an opening portion at a position corresponding to the independent liquid supply port by means of a back surface exposure machine.

Figure 1F:
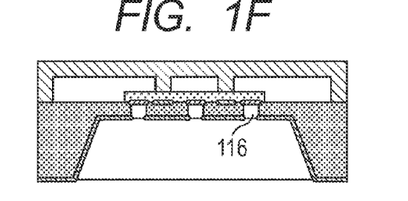
Figure 1G:
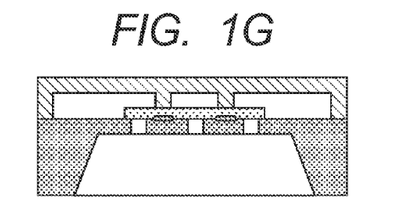
Figure 1H:
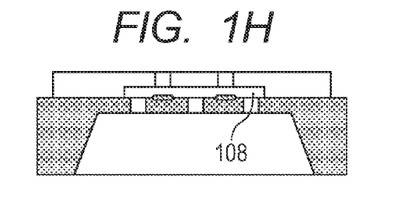

As illustrated in FIG. 1F, the mask 115 for forming the independent liquid supply port is then used as a mask to form an independent liquid supply port 116 in the silicon substrate 103 by dry etching using the above-described Bosch process. In the process according to the present invention, the thickness of the sheath formed in the protection film removing step is made thicker than the sheath formed in the Si etching step, whereby the occurrence of the tilt is inhibited. No particular limitation is imposed on the depth of the independent liquid supply port 116. However, the depth may be controlled to, for example, 50 µm or more and 400 µm or less. As illustrated in FIG. 1G, the mask 115 for forming the independent liquid supply port, the etch-stop layer 104 and the insulation film are then removed. As illustrated in FIG. 1H, the protection resist 113 is then removed, and the positive resist 107 is subsequently removed, whereby a liquid flow path 108 is formed. A substrate for a liquid ejection head is completed according to the above-described process.

EXAMPLE 1

A process for producing a substrate for a liquid ejection head according to this example will now be described with reference to FIGS. 1A to 1H. A silicon substrate 103 having a thickness of 700 µm as illustrated in FIG. 1A was first provided. On a front surface of the silicon substrate 103, an ejection-energy-generating element 105, an etch-stop layer 104 and an insulation layer (not illustrated) formed on the ejection-energy-generating element 105 and the etch-stop layer 104 are arranged. The etch-stop layer 104 was formed by forming an aluminum film having a thickness of 500 nm by sputtering. The insulation layer was formed by forming an oxidized film having a thickness of 700 nm by plasma CVD. In addition, an adherence layer (not illustrated), a positive resist 107 and an ejection-orifice-forming member 106 are formed on the side of the front surface of the silicon substrate 103 for subsequently forming a liquid flow path wall and a liquid ejection orifice. The adherence layer is composed of poly(ether imide). The positive resist 107 is a mold material to be a liquid flow path. The ejection-orifice-forming member 106 forms a flow path wall and a liquid ejection orifice 101. In addition, a thermally oxidized film 111 having a thickness of 600 nm is formed on a back surface of the silicon substrate 103. Further, an etching mask 112 composed of poly(ether imide) is formed for subsequently forming a common liquid supply port.

A protection resist 113 for protecting the silicon substrate 103 and the ejection-orifice-forming member 106 against an alkaline solution was then formed on the surfaces thereof as illustrated in FIG. 1B. OBC (trade name, product of TOKYO OHKA KOGYO CO., LTD.) was used for the protection resist 113. The silicon substrate 103 was then immersed in a 22% by mass TMAH solution for 12 hours at 83° C. to form a common liquid supply port 114 as illustrated in FIG. 1C. The depth of the common liquid supply port 114 was 600 µm from the back surface of the silicon substrate 103. As illustrated in FIG. 1D, the etching mask 112 and the thermally oxidized film 111 were then removed. As illustrated in FIG. 1E, a mask 115 for forming an independent liquid supply port was then formed. The mask 115 for forming the independent liquid supply port was formed by evenly applying a photosensitive material (trade name: AZP4620, product of AZ Electronic Materials Co.) by means of a sprayer and then forming an opening portion at a position corresponding to the independent liquid supply port by means of a back surface exposure machine.

Figure 2A:
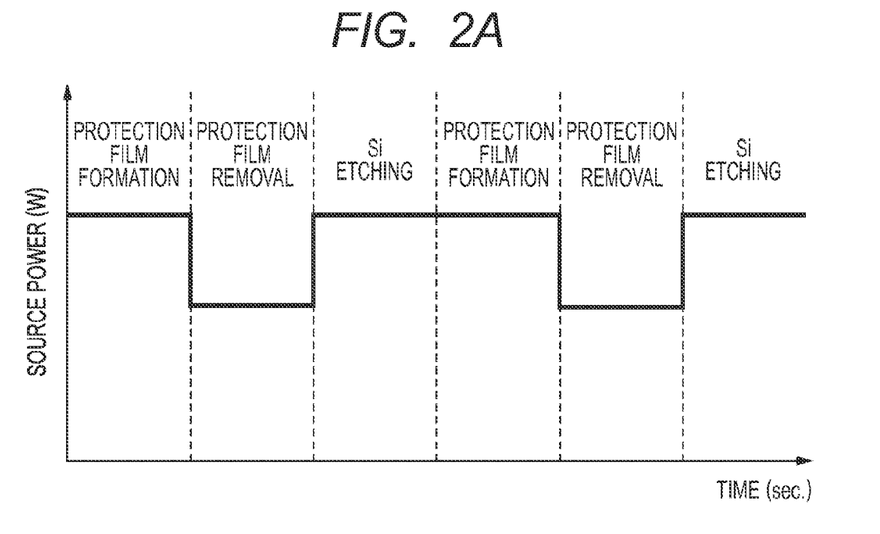
FIGS. 2A and 2B illustrate timing charts indicating controlled states of source power and bias power in Example 1.
Figure 2B:
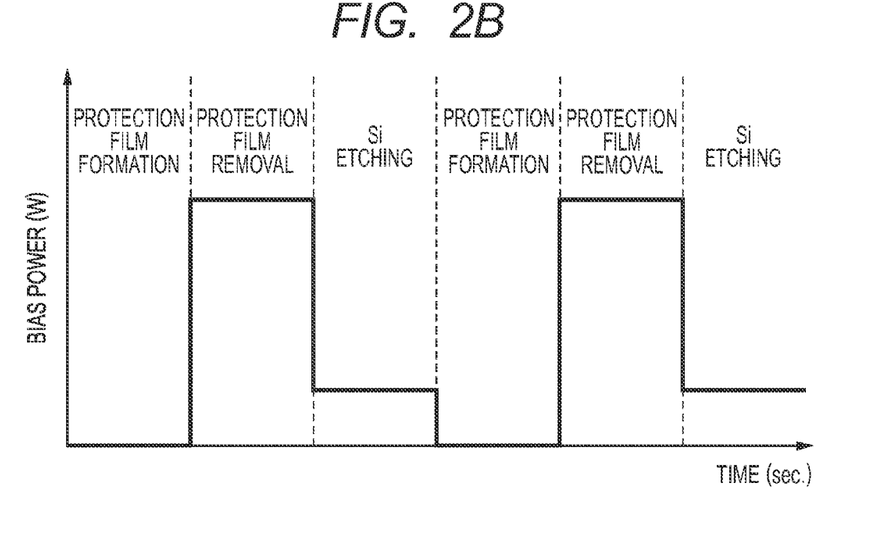

As illustrated in FIG. 1F, the mask 115 for forming the independent liquid supply port was then used as a mask to form an independent liquid supply port 116 in the silicon substrate 103 by dry etching using the above-described Bosch process. Conditions in respective steps of the Bosch process are shown in Table 1. In addition, the variations of source power and bias power in the respective steps are illustrated in FIGS. 2A and 2B, respectively. The source power in the protection film removing step was set lower than the source power in the protection film forming step and in the Si etching step for making the sheath in the protection film removing step thick to inhibit the tilt. The reduction rate of the source power in the protection film removing step with respect to the source power in the Si etching step was 27%. The relation between the thicknesses of the sheaths was determined by means of the Child-Langmuir Law from the relation between the source powers. As a result, the sheath formed in the protection film removing step was thicker than the sheath formed in the Si etching step.

As illustrated in FIG. 1G, the mask 115 for forming the independent liquid supply port, the etch-stop layer 104 and the insulation film were then removed. As illustrated in FIG. 1H, the protection resist 113 was then removed, and the positive resist 107 was subsequently removed, whereby a liquid flow path 108 was formed. A substrate for a liquid ejection head was completed according to this process. The tilt of the independent liquid supply port of the thus-obtained substrate for the liquid ejection head was measured. As a result, the tilt was about 2 µm. Incidentally, the measurement of the tilt was made by measuring front and back opening positions of the independent liquid supply port in the substrate through a dual-side microscope.

EXAMPLE 2

A substrate for a liquid ejection head was prepared in the same manner as in Example 1 except that the conditions in the respective steps of the Bosch process were changed to the conditions shown in Table 2. The reduction rate of the source power in the protection film removing step with respect to the source power in the Si etching step was 45%. The relation between the thicknesses of the sheaths was determined by means of the Child-Langmuir Law from the relation between the source powers. As a result, the sheath formed in the protection film removing step was thicker than the sheath formed in the Si etching step. The tilt of the independent liquid supply port of the thus-obtained substrate for the liquid ejection head was measured. As a result, the tilt was about 1.5 µm.

COMPARATIVE EXAMPLE 1

Figure 3A:
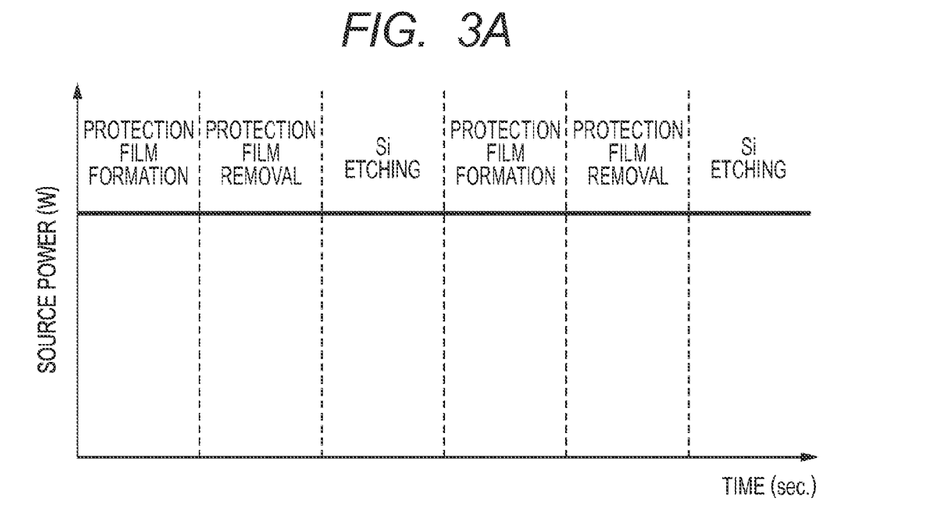
FIGS. 3A and 3B illustrate timing charts indicating controlled states of source power and bias power in Comparative Example 1.
Figure 3B:
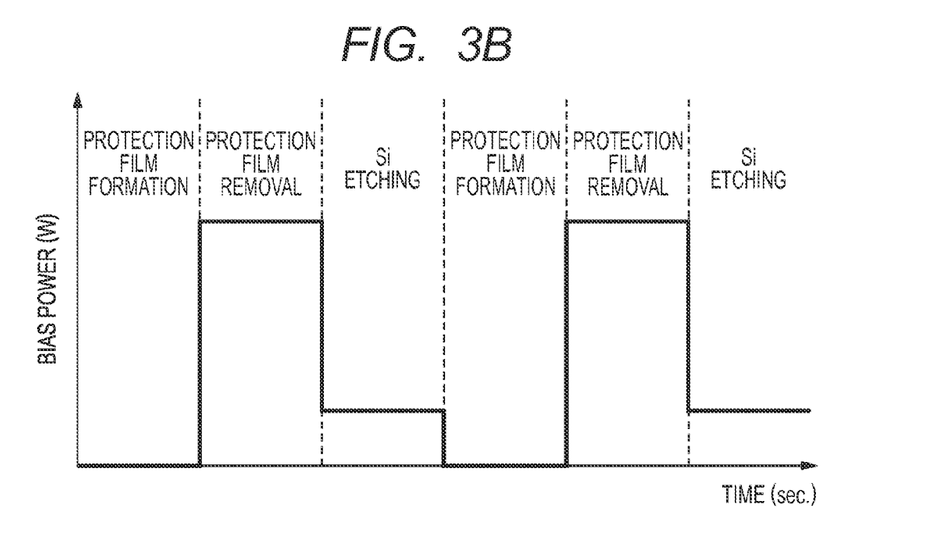

A substrate for a liquid ejection head was prepared in the same manner as in Example 1 except that the conditions in the respective steps of the Bosch process were changed to the conditions shown in Table 3. The variations of source power and bias power in the respective steps of the Bosch process are illustrated in FIGS. 3A and 3B, respectively. The reduction rate of the source power in the protection film removing step with respect to the source power in the Si etching step was 0%. The relation between the thicknesses of the sheaths was determined by means of the Child-Langmuir Law from the relation between the source powers. As a result, the sheath formed in the protection film removing step was not thicker than the sheath formed in the Si etching step. The tilt of the independent liquid supply port of the thus-obtained substrate for the liquid ejection head was measured. As a result, the tilt was about 3 µm.

Incidentally, in these examples, an effect on the tilt caused by the steric obstacle of the common liquid supply port formed in the silicon substrate was exhibited. However, the present invention is effective to the tilt caused by another steric obstacle. For example, an end portion itself of the silicon substrate may become a steric obstacle in an outermost periphery of the silicon substrate, and the present invention is also effective to the tilt caused thereby.

TABLE 1

|  | Protection film forming step | Protection film removing step | Si etching step |
|---|---|---|---|
| Source power (W) | 2,200 | 1,600 | 2,200 |
| Bias power (W) | 0 | 160 | 30 |
| Flow rate of $SF_6$ (Pa·m³/s) | — | 0.676 | 0.676 |
| Flow rate of $C_4F_8$ (Pa·m³/s) | 0.676 | — | — |

TABLE 2

|  | Protection film forming step | Protection film removing step | Si etching step |
|---|---|---|---|
| Source power (W) | 2,200 | 1,200 | 2,200 |
| Bias power (W) | 0 | 160 | 30 |
| Flow rate of $SF_6$ (Pa·m³/s) | — | 0.676 | 0.676 |
| Flow rate of $C_4F_8$ (Pa·m³/s) | 0.676 | — | — |

TABLE 3

|  | Protection film forming step | Protection film removing step | Si etching step |
|---|---|---|---|
| Source power (W) | 2,200 | 2,200 | 2,200 |
| Bias power (W) | 0 | 160 | 30 |
| Flow rate of $SF_6$ (Pa·m³/s) | — | 0.676 | 0.676 |
| Flow rate of $C_4F_8$ (Pa·m³/s) | 0.676 | — | — |

According to the present invention, the occurrence of the tile can be inhibited without lowering productivity in the production of the substrate for the liquid ejection head.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-119767, filed Jun. 6, 2013, which is hereby incorporated by reference herein in its entirety.

What is claimed is:

1. A process for producing a substrate for a liquid ejection head, comprising a step of forming a liquid supply port passing through a silicon substrate by dry etching, the step being a step of sequentially repeating the steps of:
   (1) forming an etching protection film on the silicon substrate,
   (2) removing a bottom portion of the etching protection film, and
   (3) etching the silicon substrate,
   wherein a sheath formed in the step (2) is thicker than a sheath formed in the step (3).

2. A process for producing a substrate for a liquid ejection head, comprising a step of forming a liquid supply port in a silicon substrate, the step comprising the steps of:

(a) forming a common liquid supply port in the silicon substrate, and
(b) forming an independent liquid supply port passing through the silicon substrate in a bottom of the common liquid supply port by dry etching, the step (b) being a step of sequentially repeating the steps of:
(1) forming an etching protection film on the silicon substrate,
(2) removing a bottom portion of the etching protection film, and
(3) etching the silicon substrate,
wherein a sheath formed in the step (2) is thicker than a sheath formed in the step (3).

3. The process according to claim 1, wherein the source power in the step (2) is lower than the source power in the step (3).

4. The process according to claim 3, wherein a reduction rate of the source power in the step (2) with respect to the source power in the step (3) is 10% or more and 50% or less.

5. The process according to claim 1, wherein the step (1) is a step of forming the etching protection film by plasma using a fluorocarbon (CF) gas.

6. The process according to claim 1, wherein the step (2) is a step of removing the bottom portion of the etching protection film by plasma using $SF_6$ gas.

7. The process according to claim 1, wherein the step (3) is a step of etching the silicon substrate by plasma using $SF_6$ gas.

8. The process according to claim 2, wherein the source power in the step (2) is lower than the source power in the step (3).

9. The process according to claim 8, wherein a reduction rate of the source power in the step (2) with respect to the source power in the step (3) is 10% or more and 50% or less.

10. The process according to claim 2, wherein the step (1) is a step of forming the etching protection film by plasma using a fluorocarbon (CF) gas.

11. The process according to claim 2, wherein the step (2) is a step of removing the bottom portion of the etching protection film by plasma using $SF_6$ gas.

12. The process according to claim 2, wherein the step (3) is a step of etching the silicon substrate by plasma using $SF_6$ gas.

13. A process for producing a substrate for a liquid ejection head, comprising a step of forming a liquid supply port in a silicon substrate, the step comprising the steps of:
(a) forming a common liquid supply port in the silicon substrate, and
(b) forming an independent liquid supply port passing through the silicon substrate in a bottom of the common liquid supply port by dry etching, the step (b) being a step of sequentially repeating the steps of:
(1) forming an etching protection film on the silicon substrate,
(2) removing a bottom portion of the etching protection film, and
(3) etching the silicon substrate,
wherein a source power in the step (2) is lower than a source power in the step (3).

* * * * *